(12) United States Patent
Kametani et al.

(10) Patent No.: US 7,465,962 B2
(45) Date of Patent: Dec. 16, 2008

(54) SEMICONDUCTOR LIGHT EMITTING DEVICE AND MANUFACTURING METHOD THEREFOR

(75) Inventors: Eiji Kametani, Yamatotakada (JP); Yukari Inoguchi, Kitakatsuragi-gun (JP); Nobuyuki Watanabe, Nara (JP); Tetsuroh Murakami, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/477,654

(22) Filed: Jun. 30, 2006

(65) Prior Publication Data

US 2007/0007543 A1 Jan. 11, 2007

(30) Foreign Application Priority Data

Jun. 30, 2005 (JP) ............................... 2005-191731

(51) Int. Cl.
  *H01L 33/00* (2006.01)
(52) U.S. Cl. ........................... 257/98; 257/79; 257/627; 257/618; 257/E33.027
(58) Field of Classification Search ................. 257/628, 257/618, 79, 98, 627, E33.027
  See application file for complete search history.

(56) References Cited

U.S. PATENT DOCUMENTS 5,376,580 A   12/1994  Kish et al.
5,403,916 A * 4/1995  Watanabe et al. ............. 438/26
5,502,316 A   3/1996   Kish et al.
6,177,359 B1  1/2001   Chen et al.

FOREIGN PATENT DOCUMENTS

| JP | 2001-53056 A | 2/2001 |
|---|---|---|
| JP | 2001-57441 A | 2/2001 |
| JP | 3230638 B2 | 9/2001 |
| JP | 3239061 B2 | 10/2001 |
| JP | 3532953 B2 | 3/2004 |
| JP | 2006-156950 A | 6/2006 |

* cited by examiner

*Primary Examiner*—Minh-Loan Tran
*Assistant Examiner*—Selim Ahmed
(74) *Attorney, Agent, or Firm*—Nixon & Vanderhye PC

(57) ABSTRACT

A semiconductor light emitting device in the present invention is formed by laminating an epitaxial layer 30 including an AlGaInP active layer and a second wafer 23 which transmits light derived from the active layer. The crystal axes of the epitaxial layer 30 and the second wafer 23 are generally aligned with each other and are in the range of $-15°$ to $+15°$ with respect to a lateral face $\{100\}$ of the second wafer 23. This semiconductor light emitting device, which is a joining type with high external emission efficiency, allows uniform wafer bonding to be achieved over the entire wafer face with ease and with a high yield without causing bonding failure and wafer cracks.

5 Claims, 18 Drawing Sheets

————— CRACKED PORTIONS

SEMICONDUCTOR LIGHT EMITTING DEVICE AND MANUFACTURING METHOD THEREFOR

CROSS-REFERENCE TO RELATED APPLICATIONS

This nonprovisional application claims priority under 35 U.S.C. §119(a) on Patent Application No. 2005-191731 filed in Japan on Jun. 30, 2005, the entire contents of which are hereby incorporated by reference.

BACKGROUND OF THE INVENTION

The present invention relates to a semiconductor light emitting device to be used as a light source of, for example, illuminations, information display apparatuses and information transmission apparatuses and relates to a manufacturing method therefor.

Conventionally, it has been very important for light emitting diodes (herein below referred to as LEDs) to enhance efficiency to take out internally generated light, i.e., external emission efficiency.

In order to enhance the external emission efficiency of LEDs, LED substrates transparent to emission wavelengths are generally used.

When a substrate opaque to emission wavelengths is used for an LED, the substrate absorbs emitted light and therefore light is emitted substantially only to a face (hereinafter, referred to as an upper face) on one side other than the substrate side with respect to an emission layer.

On the other hand, when a substrate transparent to emission wavelengths is used for an LED, light can be emitted not only from the upper face but also from other faces. Moreover, in the case where the substrate-side face of the LED (hereinafter, referred to as a lower face) is bonded, light going from the emission layer to the substrate side can be reflected by the lower face so as to be emitted from the upper face and lateral faces and the like.

LEDs having such a transparent substrate have conventionally been applied to infrared LEDs with use of InGaAsP-base semiconductor materials, infrared and red LEDs with use of AlGaAs-base semiconductor materials, yellow LEDs with use of GaAsP-base semiconductor materials, green LEDs with use of GaP-base semiconductor materials, and the like.

In recent years, in the development of red, yellow and green LEDs with use of AlGaInP-base semiconductor materials, a wafer bonding technology for directly bonding a plurality of substrates to one another is rapidly coming into practical use. With the wafer bonding technology, substrates transparent to emission wavelengths are bonded to LED substrates so as to enhance the external emission efficiency of the LEDs.

A first prior art of this kind is disclosed in JP No. 3230638 B. In the first prior art, a GaP (gallium phosphorus)-base transparent substrate is directly bonded, through pressurization and high temperature treatment, to the surface of an AlGaInP (aluminum gallium indium phosphorus)-base semiconductor layer formed on a GaAs (gallium arsenide) substrate.

A second prior art is disclosed in JP No. 3532953 B. In the second prior art, an LED emission layer and a transparent layer are wafer-bonded via a bonding layer containing In (indium).

A third prior art is disclosed in JP 2001-53056 A. In the third prior art, first on a first epitaxial layer grown on a first substrate, a second epitaxial layer is grown via a mask, and on the second epitaxial layer, a trench reaching the mask is formed. Next, after a second substrate is wafer-bonded onto the second epitaxial layer, an etchant is put into the trench so as to etch the mask away. By this, the second epitaxial layer and the second substrate are separated from the first substrate and the first epitaxial layer.

Moreover, a fourth prior art is disclosed in JP 2001-57441 A. In the fourth prior art, a trench is formed on at least one of the bonding faces of a first semiconductor substrate and a second semiconductor substrate, before the first semiconductor substrate and the second semiconductor substrate are bonded together.

However, the respective prior arts have following problems.

That is, in the first prior art, it is difficult to uniformly bond the entire surface of a transparent substrate to a wafer with a diameter of 2 inches or 3 inches, which is generally used in manufacturing of LEDs, with an excellent yield.

In a test conducted by the present applicant, with a use of a jig 50 as shown in the schematic front view of FIG. 11A and the schematic plan view of FIG. 11B, a second wafer 123 that was a GaP transparent substrate was pressurized in tight contact to a first wafer 122 composed of a GaAs substrate and an AlGaInP-base semiconductor layer formed on the GaAs substrate, and was subjected to high temperature treatment in a heating furnace. Herein, the first and second wafers 122, 123 were both wafers with a diameter of 2 inches.

When the first and second wafers 122, 123 were taken out of the heating furnace after the high temperature treatment, the first and second wafers 122, 123 had cracks, and therefore the next manufacturing step could not be taken.

FIG. 12A is a schematic plan view showing the first wafer 122 before bonding, and FIG. 12B is a schematic cross sectional view as viewed from the line XIIB-XIIB in FIG. 12A.

FIG. 13A is a schematic plan view showing the first and second wafers 122, 123 after bonding, and FIG. 13B is a schematic cross sectional view as viewed from the line XIIIB-XIIIB in FIG. 13A. It is to be noted that bonded portions are hatched in FIG. 13A.

As shown in FIGS. 13A and 13B, a crack 112 is generated in the first and second wafers 122, 123, and bonded portions 110 are generated at central and radially outer portions of the wafer in an island-like state and so those other than the bonded portions are not bonded. As a result, a bonding failure occurs.

Therefore, the first prior art has a problem of difficulty of its application to mass production of LEDs.

In the second prior art, after the LED layer is formed on the grown substrate and before the transparent substrate is wafer-bonded, the grown substrate is removed. The LED layer after the grown substrate has been removed is thin and prone to breakage, and this causes reduction in yield.

Further, in the second prior art, in order to suppress breakage and cracking of the wafer during wafer bonding, a unit to pressurize the wafer by a pneumatic piston upon arrival of the wafer at a temperature at which the wafer is softened is necessary. This causes complication of manufacturing equipment and complication of the manufacturing equipment control.

The third prior art does not provide details of the wafer bonding step.

In the fourth prior art, according to a test conducted by the present applicant, with a use of a jig 50, grooves with a width of 30 μm and a depth of 30 μm were formed by dicing at intervals of 280 μm on the surface of a 270 μm-thick first wafer 122 composed of a GaAs substrate and an AlGaInP-base semiconductor layer formed thereon, and a second wafer 123 that was a GaP transparent substrate was pressurized in tight contact to the first wafer 122 and was subjected to high temperature treatment in a heating furnace. In this case, the first and second wafers 122, 123 were both wafers with a diameter of 2 inches.

When the first and second wafers 122, 123 were taken out of the heating furnace after the high temperature treatment, the wafers sometimes had cracks along the groove forming direction. For example, in the case where a groove extending in a direction parallel to <110> direction and a groove extending in a direction perpendicular to the <110> direction were formed on the surface of the first wafer 122, the first and second wafers 122, 123 were broken into about 10 pieces and became useless as a product.

SUMMARY OF THE INVENTION

An object of the present invention is to provide a manufacturing method for a semiconductor light emitting device which makes it possible to manufacture semiconductor light emitting devices having high external emission efficiency with ease and with a high yield without causing bonding failure and wafer breakage.

Another object of the present invention is to provide a semiconductor light emitting device which can be manufactured by such a manufacturing method.

In order to achieve the above object, there is provided a semiconductor light emitting device comprising:

a plurality of semiconductor layers including at least an emission layer; and a transparent layer which transmits light from the emission layer, the respective layers being laminated together, wherein crystal axes of the semiconductor layers and the transparent layer are generally aligned with each other, and a direction of lateral faces of the transparent layer is in a range of −15° to +15° with respect to a [100] direction.

Herein, the term "direction of lateral faces" refers to the normal direction of the lateral faces.

In the case of forming the above structured semiconductor light emitting device on a wafer, it is so arranged that the lateral face direction of the transparent layer falls within the range of −15° to +15° with respect to the [100] direction in order to alleviate the stress necessary to cleave the wafer and to prevent wafer cracks.

Therefore, it becomes possible to manufacture the semiconductor light emitting device having high external emission efficiency with ease and with a high yield without causing bonding failure and wafer cracks.

In one embodiment of the present invention, the transparent layer has a multilayered structure.

According to the semiconductor light emitting device in this embodiment, even when the transparent layer has a multilayered structure, it becomes possible to manufacture the semiconductor light emitting device having high external emission efficiency with ease and with a high yield.

In one embodiment of the present invention, the lateral faces of the transparent layer are rough faces.

According to the semiconductor light emitting device in this embodiment, the lateral faces of the transparent layer are rough faces and this increases light take-out efficiency.

In one embodiment of the present invention, projections and depressions are formed on the lateral faces of the transparent layer.

According to the semiconductor light emitting device in this embodiment, projections and depressions are formed on the lateral faces of the transparent layer and this enhances light take-out efficiency.

In one embodiment of the present invention, four corners of the semiconductor layer are trimmed.

According to the semiconductor light emitting device in this embodiment, a photomask which is trimmed to be round at its four corners is attached to the surface of a first wafer on which at least one semiconductor layer including the emission layer is formed, and then the first wafer is etched to round the corners of the semiconductor layer on the first wafer (see FIG. 7A). When the surface of the semiconductor layer is in a square shape in particular, the semiconductor layer is more prone to deficiency due to insufficient strength after joining the first and second wafers. However, trimming the corners of the semiconductor layer before joining the first and second wafers makes it possible to prevent deficiency of the semiconductor layer.

Moreover, the trimming has an effect of preventing deficiencies of the semiconductor layer from occurring even in the subsequent handling process.

Also, there is provided a manufacturing method for a semiconductor light emitting device, comprising the steps of:

forming a bonding failure prevention groove on at least either a surface of a first wafer on which at least one semiconductor layer including an emission layer is formed or a surface of a second wafer transparent to an emission wavelength of the emission layer;

placing the second wafer on the surface of the first wafer in such a way that the surface of the first wafer and the surface of the second wafer are in contact with each other and a crystal axis of the first wafer and a crystal axis of the second wafer are substantially aligned with each other;

applying compressing force onto a contact face between the first wafer and the second wafer while heating the contact face; and removing part of the first wafer from the first wafer and the second wafer in such a way that at least the emission layer remains on the second wafer, wherein the bonding failure prevention groove extends so as to form an angle from 30 degrees to 60 degrees with respect to a {110} plane that is a wafer cleavage plane.

According to the manufacturing method for a semiconductor light emitting device, a bonding failure prevention groove is formed on at least either the surface of the first wafer or the surface of the second wafer. The bonding failure prevention groove extends in such a way as to form an angle from 30 degrees to 60 degrees with respect to a {110} plane that is a wafer cleavage plane. Under these circumstances, compressing force is applied onto a contact face between the first wafer and the second wafer while the contact face is heated. At this point, if a thermal expansion coefficient of the first wafer is different from that of the second wafer, expansion and contraction stress is applied to the portion of the bonding failure prevention groove. However, since the bonding failure prevention groove extends in the direction forming an angle from 30 degrees to 60 degrees with respect to the {110} plane that is the wafer cleavage plane most prone to breakage, the stress to cleave the first and second wafers is reduced and therefore wafer breakage can be prevented.

That is, a bonding failure prevention groove extending in the way of forming an angle of, for example, 45 degrees with respect to the {110} plane, which is a wafer cleavage plane, is formed on at least either the surface of the first wafer or the surface of the second wafer, so that the stress generated by expansion and contraction can be dispersed from the cleavage direction, and this makes it possible to uniformly bond the first wafer and the second wafer without causing wafer cracks.

Therefore, it becomes possible to manufacture the semiconductor light emitting device having high external emission efficiency with ease and with a high yield without causing bonding failure and wafer cracks.

The bonding failure prevention groove should preferably extend in the way of forming an angle of 45 degrees with respect to the {110} plane that is a wafer cleavage plane since this arrangement can most disperse the stress generated by expansion and contraction.

Moreover, the extending direction of the bonding failure prevention groove should preferably be generally parallel to at least either the surface of the first wafer or the surface of the second wafer.

Even in the case where the first and second wafers are off-angle substrates widely used in vapor phase epitaxy, it becomes possible to manufacture the semiconductor light emitting device having high external emission efficiency with ease and with a high yield.

The manufacturing method for a semiconductor light emitting device is applicable to the case of forming joining-type semiconductor light emitting devices.

In the step of heating the contact face, the first and second wafers are subjected to heating treatment in the range of, for example 700° C. to 1000° C. Moreover, the first and second wafers after being subjected to the heating treatment are cooled to, for example, room temperature.

In one embodiment of the present invention, the second wafer has a multilayered structure.

According to the manufacturing method for a semiconductor light emitting device in this embodiment, even when the second wafer has a multilayered structure, it becomes possible to manufacture the semiconductor light emitting device having high external emission efficiency with ease and with a high yield.

In one embodiment of the present invention, a stress relaxation film is placed on an opposite face of the contact face of at least either the first wafer or the second wafer.

According to the manufacturing method for a semiconductor light emitting device in this embodiment, in the state that a stress relaxation film is placed on the opposite face of the contact face of at least either the first wafer or the second wafer, compressing force is applied onto the contact face while the contact face is heated. This allows further reduction of deviation in stress distribution on the contact face.

Therefore, it becomes possible to achieve an effect of uniformly dispersing the stress, which is generated by a difference in expansion coefficient between the first and second wafers due to temperature rise and fall during thermal treatment, from the wafer cleavage plane of the first and second wafers and it also becomes possible to prevent bonding failure between the first and second wafers on their contact face.

In one embodiment of the present invention, the stress relaxation film has a stress relaxation rate in a range of 1.5% to 3.0% with a tightening surface pressure in a range of 5 $kg/cm^2$ to 500 $kg/cm^2$.

According to the manufacturing method for a semiconductor light emitting device in this embodiment, the stress relaxation film having a stress relaxation rate in the range of 1.5% to 3.0% with a tightening surface pressure in the range of 5 $kg/cm^2$ to 500 $kg/cm^2$ allows effective reduction of stress deviation on the bonding face between the first wafer and the second wafer.

More preferably, the stress relaxation rate is in the range of 1.8% to 2.5% with a tightening surface pressure in the range of 5 $kg/cm^2$ to 20 $kg/cm^2$.

In one embodiment of the present invention, the stress relaxation film has a thickness from 0.2 mm to 2.0 mm.

According to the manufacturing method for a semiconductor light emitting device in this embodiment, the stress relaxation film having a thickness from 0.2 mm to 2.0 mm allows effective reduction of stress deviation on the bonding face between the first and second wafers.

In an experiment conducted by the present applicant, the stress relaxation film with a thickness of less than 0.2 mm fails to achieve sufficient stress relaxation, whereas the stress relaxation film with a thickness of more than 2 mm has difficulty in transmitting stress to the first and second wafers.

However, depending on the materials of the stress relaxation film, some thickness out of the range of 0.2 mm to 2.0 mm may be an optimum for the stress relaxation film.

In one embodiment of the present invention, a plurality of the bonding failure prevention grooves are formed at specified intervals so as to face the contact face.

According to the manufacturing method for a semiconductor light emitting device in this embodiment, with the presence of a plurality of the bonding failure prevention grooves formed at specified intervals in the state of facing the contact face, compressing force is applied upon the contact face while the contact face is heated. This reduces deviation in stress distribution on the contact face, and therefore the bonding failure between the first and second wafers on the contact face can be prevented.

In one embodiment of the present invention, the specified interval is substantially equal to a width of chips obtained by dividing the first and second wafers.

According to the manufacturing method for a semiconductor light emitting device in this embodiment, the bonding failure prevention grooves are disposed at intervals almost equal to the width of chips obtained by dividing the first and second wafers, and therefore dividing the first and second wafers along the bonding failure prevention grooves makes it possible to easily obtain semiconductor light emitting device chips.

In one embodiment of the present invention, the bonding failure prevention groove is formed by dicing.

According to the manufacturing method for a semiconductor light emitting device in this embodiment, the bonding failure prevention groove is formed by dicing, and this brings about such advantages that the bonding failure prevention grooves are easily formed on the surface of at least either the first wafer or the second wafer and that a PN junction section in the first wafer can be divided into the size identical to the chip size and so it is easy to conduct tests midway through the manufacturing steps.

Moreover, since the bonding failure prevention groove is formed by dicing, the groove width of the bonding failure prevention groove can be decreased and cutting margins can be reduced, while an angle from the cleavage can be accurately adjusted.

In one embodiment of the present invention, the bonding failure prevention groove is formed by etching.

According to the manufacturing method for a semiconductor light emitting device in this embodiment, the bonding failure prevention groove is formed by etching, and this brings about such advantages that the bonding failure prevention grooves are easily formed on the surface of at least either the first wafer or the second wafer and that the wafer etching face is coated with an overcoat by resist application before etching process so that presetting a desired emission layer pattern on the resist allows formation of various light emission patterns in concurrence with the groove formation, as well as that a PN junction section in the first wafer can be divided into the size identical to the chip size and so it is easy to conduct tests midway through the manufacturing steps.

In one embodiment of the present invention, the bonding failure prevention groove has a depth from 5 μm to 80 μm.

According to the manufacturing method for a semiconductor light emitting device in this embodiment, the bonding failure prevention groove has a depth from 5 μm to 80 μm, and this makes it possible to reduce effectively deviation in stress distribution on the contact face.

If the bonding failure prevention groove is too shallow, i.e., the depth of the bonding failure prevention groove is less than 5 μm, then the adhesive surface becomes uneven and unjoined portions are generated on the contact face.

If the bonding failure prevention groove is too deep, i.e., the depth of the bonding failure prevention groove is more than 80 μm, then at least either the first wafer or the second wafer can no longer withstand the stress and causes wafer cracks to occur.

It is to be noted that the bonding failure prevention groove in the first wafer or the second wafer on which the bonding failure prevention groove is formed should preferably has a depth from the bottom of the bonding failure prevention groove to the opposite side of the contact face to be not less than 100 μm.

In one embodiment of the present invention, at least either the first wafer or the second wafer has a thickness from 100 μm to 300 μm.

According to the manufacturing method for a semiconductor light emitting device in this embodiment, at least either the first wafer or the second wafer has a thickness from 100 μm to 300 μm, and therefore an effect of preventing wafer cracks can reliably be ensured.

That is, the smaller thickness of the first and second wafers brings about more flexibility and more effective bonding failure reduction, though the first and second wafers become more prone to cracks. By forming the bonding failure prevention groove on the contact face, the stress on the contact face can be alleviated and this makes it possible to prevent cracks of the first and second wafers even when they are thinner.

In one embodiment of the present invention, the first wafer is different in thermal expansion coefficient from the second wafer.

According to the manufacturing method for a semiconductor light emitting device in this embodiment, even if the thermal expansion coefficient of the first wafer is not an approximation to the thermal expansion coefficient of the second wafer, it becomes possible to prevent the first and second wafers from being destroyed by stress at the time of bonding the first wafer and the second wafer.

The case where the thermal expansion coefficient of the first wafer is not an approximation to the thermal expansion coefficient of the second wafer is typified by the case where a GaAs substrate including an AlGaInP-base epitaxial layer is used as an example of the first wafer and a GaP substrate is used as an example of the second wafer.

FIG. 14A is a schematic plan view showing a first experimental wafer 222 before bonding and FIG. 14B is a schematic cross sectional view viewed from the line XIVB-XIVB in FIG. 14A.

As shown in FIGS. 14A and 14B, when the first experimental wafer 222 with a bonding failure prevention groove 226 extending in <110> direction formed on the surface was joined to a second experimental wafer 223, the first and second experimental wafers 222, 223 were cracked by expansion and contraction stress as shown in FIG. 15.

When a first experimental wafer with a bonding failure prevention groove formed on its surface at an angle of 45° with respect to <110> direction was joined to a second experimental wafer, the first and second experimental wafers were both free from cracks.

In one embodiment of the present invention, after part of the first wafer is removed, the remaining first wafer and the second wafer are divided into a plurality of chips with use of a dicing blade having a particle size ranging from #7000 to #2000, and projections and depressions are formed on lateral faces of the chips.

According to the manufacturing method for a semiconductor light emitting device in this embodiment, projections and depressions are formed on lateral faces of the chips and this makes it possible to enhance light take-out efficiency.

According to an experiment, light take-out efficiency in the case where projections and depressions are formed on the lateral faces of the chips is 1.3 times larger than that in the case where projections and depressions are not formed on the lateral faces of the chips.

Moreover, the particle size of the dicing blade should desirably be #7000 to #2000 (4/6 μm).

In one embodiment of the present invention, after division with use of the dicing blade, the lateral faces of the chips are etched.

According to the manufacturing method for a semiconductor light emitting device in this embodiment, it was confirmed that by performing etching treatment for removing damaged portions on the surface layer of the lateral face after the projections and depressions are formed on the lateral face of the chip, emitted light which is originally absorbed by the damaged layer and cannot be taken out can be emitted outside, and this further enhances the take-out efficiency.

According to an experiment, the total luminous flux of the device with application of the etching treatment was increased twice as large as that of the device without the treatment. In this case, a GaP substrate was used as an example of the second wafer, and the GaP substrate was immersed in mixed solution with a volume ratio of concentrated sulfuric acid 3: hydrogen peroxide solution water 1: water 1 to remove the damaged layer of the GaP substrate. It is to be noted that the damaged layer removal effect is similarly achieved when the projections and depressions are not formed on the lateral faces.

In one embodiment of the present invention, four corners of a square area of the semiconductor layer surrounded by the bonding failure prevention groove are trimmed by etching.

According to the manufacturing method for a semiconductor light emitting device in this embodiment, four corners of the square area are trimmed and rounded by etching, and this prevents deficiency of the four corner areas from occurring.

In one embodiment of the present invention, a current blocking layer is formed on at least either the first wafer or the second wafer.

According to the manufacturing method for a semiconductor light emitting device in this embodiment, a current blocking layer is formed on at least either the first wafer or the second wafer, and therefore forming an electrode on the first wafer or the second wafer so as to overlap with the current blocking layer makes it possible to enhance light take-out efficiency from the electrode side.

In one embodiment of the present invention, after part of the first wafer is removed, a wire bonding-side electrode substantially identical in size to the current blocking layer is formed on the remaining first wafer so as to overlap with the current blocking layer.

According to the manufacturing method for a semiconductor light emitting device in this embodiment, a wire bonding-side electrode generally identical in size to the current blocking layer is formed on the remaining first wafer so as to overlap with the current blocking layer, and therefore it becomes possible to enhance light take-out efficiency from the side of the wire-bonding-side electrode.

In one embodiment of the present invention, the current blocking layer is a depression formed on at least either the first wafer or the second wafer.

According to the manufacturing method for a semiconductor light emitting device in this embodiment, the current blocking layer is a depression formed on at least either the first wafer or the second wafer, and therefore the depression can be formed by, for example, etching.

Therefore, the depression can easily be formed on at least the first wafer or the second wafer.

In one embodiment of the present invention, a plurality of the depressions are present.

According to the manufacturing method for a semiconductor light emitting device in this embodiment, a plurality of the depressions are present and therefore it is possible to leave non-depression portions.

This makes it possible to prevent decrease in mechanical strength of the remaining first wafer against a wire bonding load applied via the wire boding-side electrode.

In one embodiment of the present invention, a wire bonding-side electrode substantially identical in size to a region in which the plurality of depressions are formed is formed on the remaining first wafer so as to overlap with the plurality of depressions.

According to the manufacturing method for a semiconductor light emitting device in this embodiment, a wire bonding-side electrode generally identical in size to a region with a plurality of depressions formed thereon is formed on the remaining first wafer so as to overlap with a plurality of depressions, and this makes it possible to enhance efficiency to take out light from the face on the side of the wire bonding-side electrode.

In one embodiment of the present invention, the plurality of depressions are formed so as to be confined in a region overlapping with the current blocking layer.

According to the manufacturing method for a semiconductor light emitting device in this embodiment, a plurality of the depressions are formed so as to be confined in a region overlapping with the current blocking layer, and this makes it possible to reliably enhance efficiency to take out light from the face on the side of the wire bonding-side electrode.

In the case of forming the semiconductor light emitting device of the present invention on a wafer, the arrangement that the lateral faces of the transparent layer is within the range of −15° to +15° with respect to a {100} plane makes it possible to alleviate stress applied to the cleavage of the wafer and to prevent wafer cracks. Therefore, it becomes possible to manufacture semiconductor light emitting devices having high external emission efficiency with ease and with a high yield without causing bonding failure and wafer cracks.

According to the manufacturing method for a semiconductor light emitting device of the present invention, the bonding failure prevention groove extending in such a way as to form an angle from 30 degrees to 60 degrees with respect to a {110} plane that is a wafer cleavage plane is formed on at least either the surface of the first wafer or the surface of the second wafer so that the stress generated by expansion and contraction can be dispersed from the cleavage direction. This makes it possible to uniformly bond the first wafer and the second wafer without causing wafer cracks.

Therefore, it becomes possible to manufacture semiconductor light emitting devices having high external emission efficiency with ease and with a high yield without causing wafer cracks.

BRIEF DESCRIPTION OF THE DRAWINGS

The present invention will become more fully understood from the detailed description given herein below and the accompanying drawings which are given by way of illustration only, and thus are not intended to limit the present invention, and wherein.

DETAILED DESCRIPTION OF THE INVENTION

The present invention will herein below be described in conjunction with embodiments with reference to the accompanying drawings.

In one embodiment of the present invention herein below, a light emitting diode as an AlGaInP (aluminum gallium indium phosphorus)-base semiconductor light emitting device having an emission layer including a quaternary quantum well is manufactured.

Figure 1:
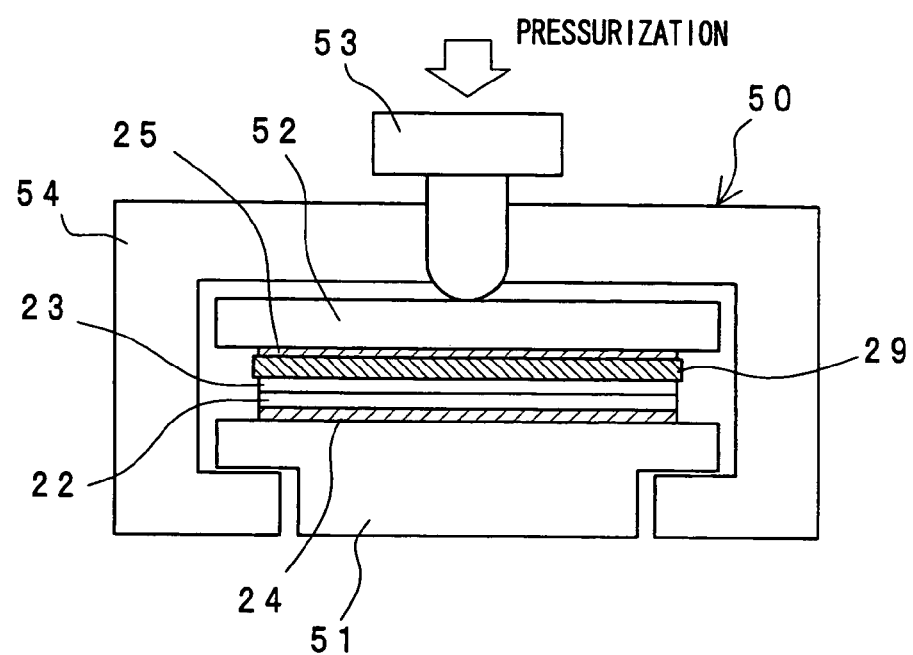
FIG. 1 is a view showing a bonding step in a manufacturing method for a semiconductor light emitting device in one embodiment of the present invention.

FIG. 1 shows a bonding step in a manufacturing method for a light emitting diode in one embodiment of the present invention.

This bonding step is a step to bond a first wafer 22 and a second wafer 23, in which compressing force is applied to a contact face between the first wafer 22 and the second wafer 23 via a relaxation film 29 as an example of a stress relaxation film, while the contact face is heated.

The first wafer 22 has an n-type GaAs (gallium arsenide) substrate and a plurality of semiconductor layers formed on the n-type GaAs substrate and including an emission layer.

The second wafer 23 is constituted of a p-type GaP substrate transparent to light from the emission layer. That is, the p-type GaP substrate exemplifies a transparent layer of the second wafer 23.

Description is herein below given of the manufacturing method for the light emitting diode with reference to FIGS. 2A to 2F. It is to be noted that shown in FIGS. 2A to 2E are portions of the first wafer 22 and the second wafer 23 which should be divided into chips.

Figure 2A:
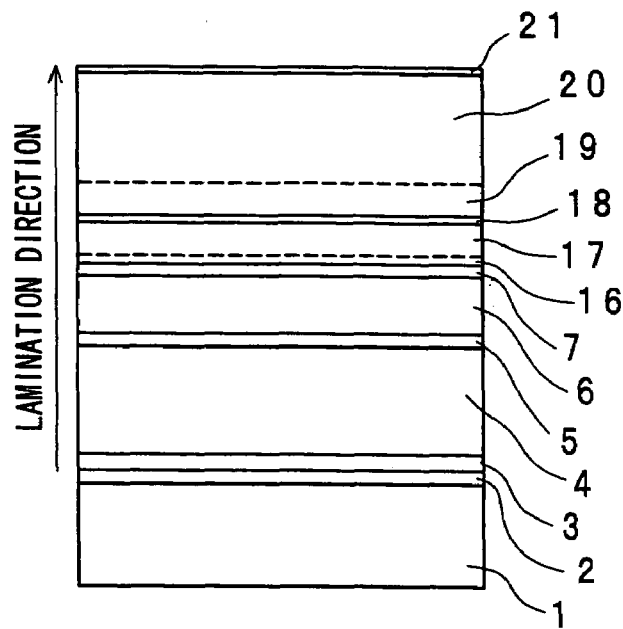
FIG. 2A is a schematic view for forming a plurality of semiconductor layers including an emission layer on a substrate.

First, as shown in FIG. 2A, on an n-type GaAs substrate 1, there are formed an n-type GaAs buffer layer 2, an n-type AlGaAs etching stop layer 3, an n-type AlGaAs current diffusion layer 4, an n-type AlGaInP buffer layer 5, an n-type AlInP cladding layer 6, an AlGaInP active layer 7 (MQW (Multiple Quantum Well) structure with four wells) as an example of an emission layer, a spacer layer 16, a p-type AlInP cladding layer 17, an intermediate layer 18, a p-type GaInP first joining contact layer 19, a p-type GaP second joining contact layer 20 and a GaAs cap layer 21. The respective layers are grown by MOCVD (Metal-Organic Chemical Vapor Deposition) process.

Figure 2B:
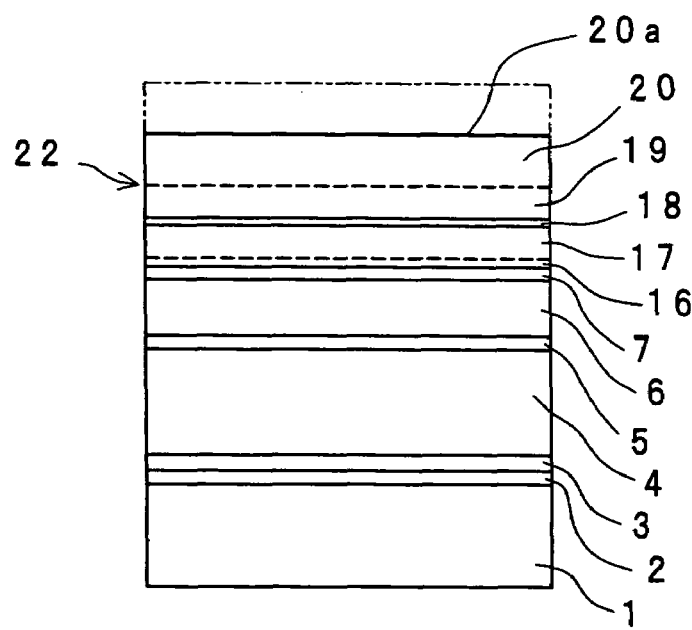
FIG. 2B is a schematic view for explaining formation of a first wafer.

Subsequently, as shown in FIG. 2B, the cap layer 21 is removed and an about 2 μm-thick portion (portion shown by a two-dot chain line in FIG. 2B) of the second joining contact layer 20 exposed by removal of the cap layer 21 is removed. Then, a surface 20a of the second joining contact layer 20 with the 2 μm-thick portion removed is polished to a mirror-smooth state by CMP (Chemical Mechanical Polishing). Thus, a first wafer 22 is obtained.

The first wafer 22 should be processed by the way of shaving the substrate for advanced prevention of bonding failure. In the present embodiment, the n-type GaAs substrate was shaved to have a substrate thickness of 270 μm. The substrate thickness, if too small, causes the first wafer 22 to crack, and therefore an appropriate value therefor is determined depending on the material of the first wafer 22 and the stress applied to the first wafer 22.

Figure 3A:
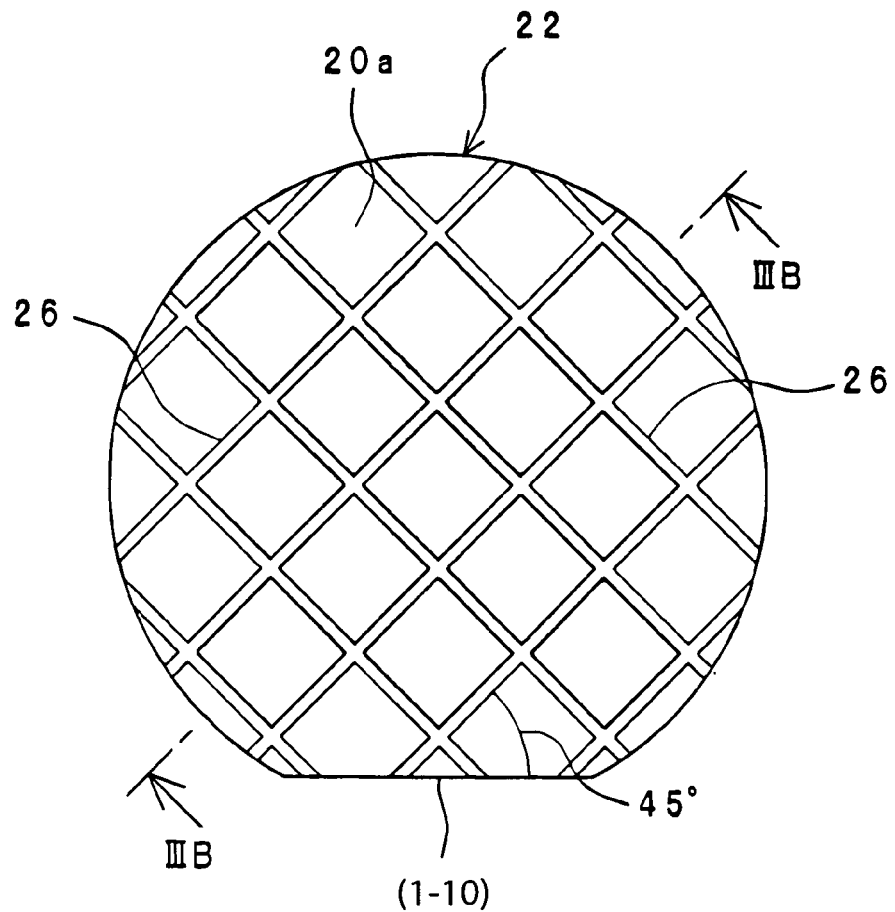
FIG. 3A is a schematic plan view showing the first wafer before bonding.
Figure 3B:
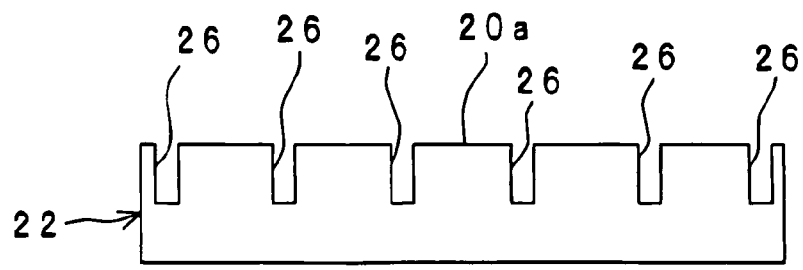
FIG. 3B is a schematic cross sectional view as viewed from the line IIIB-IIIB in FIG. 3A.
Figure 4:
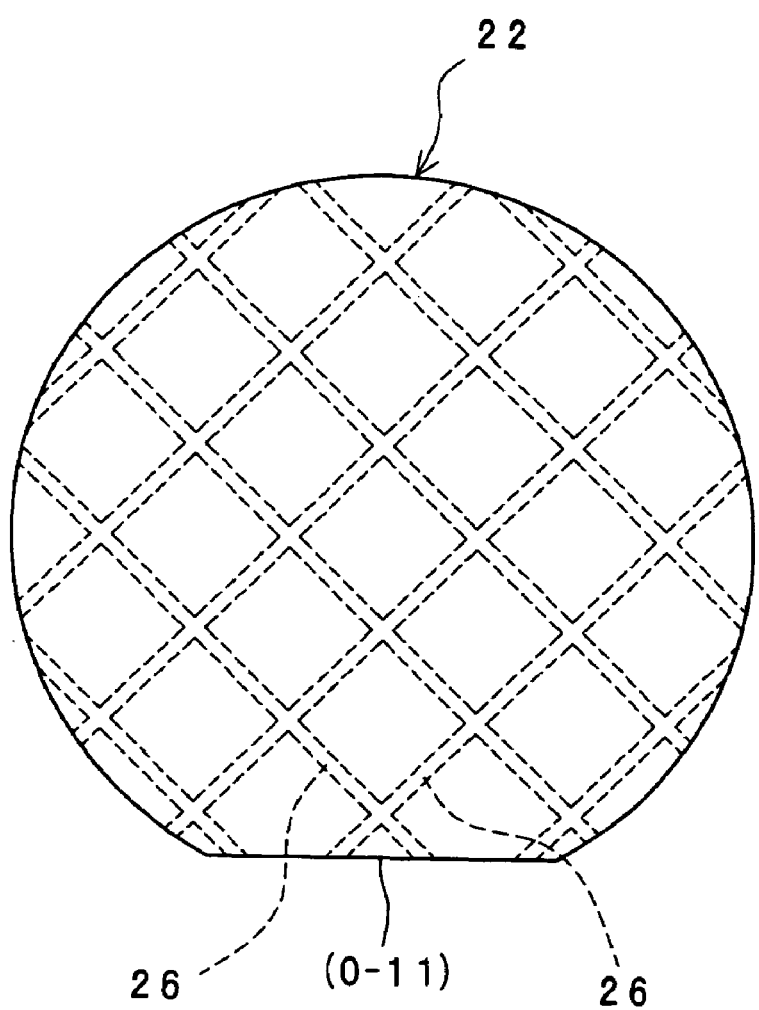
FIG. 4 is a schematic plan view showing the first and second wafers after bonding.

Next, on the epitaxial surface of the first wafer 22, i.e., the surface 20a of the second joining contact layer 20, a plurality of bonding failure prevention grooves 26 shown in FIGS. 3A, 3B and 4 are formed by dicing or by use of a photomask and etching. Each of the bonding failure prevention grooves 26 forms an angle of about 45° with respect to a (1-10) plane. More particularly, the respective bonding failure prevention grooves 26 form an angle of about 4520 with respect to the wafer cleavage direction. In other words, the respective bonding failure prevention grooves 26 extend in such a way as to form an angle of about 4520 with respect to a wafer cleavage plane. Here, crystal lattice orientations and lattice surfaces are expressed by numerals parenthesized in <>, [] and (), {}, respectively. In the numerals (indexes), negative one must be expressed by adding a "-" (bar) on the numeral in crystallography. However, it is impossible to add a bar above a numeral by the software ("WORD" by Microsoft Co.) and therefore a negative sign is added before a numeral for expression in this specification.

Figure 2C:
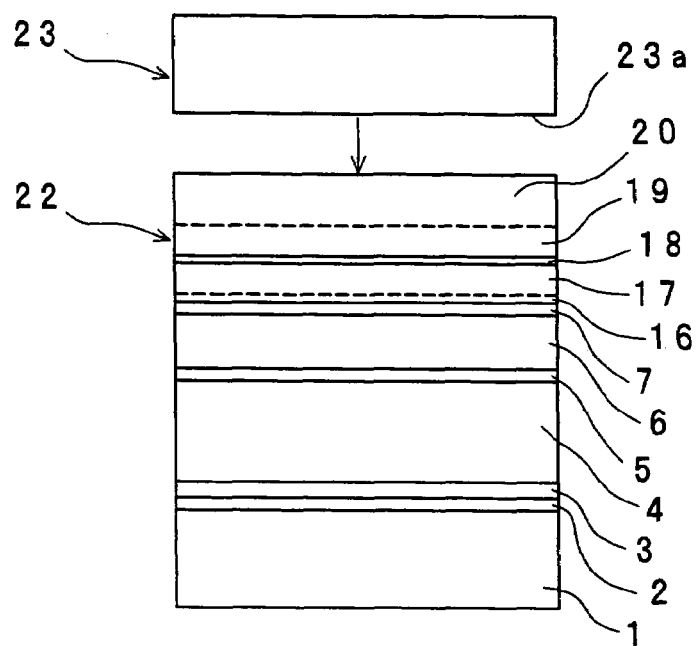
FIG. 2C is a schematic view showing a state in which a second wafer is placed on the surface of the first wafer.

After that, as shown in FIG. 2C, a second wafer 23 is placed on the surface 20a of the second joining contact layer 20 that is the surface of the first wafer 22. As a result of this, a surface 23a of the second wafer 23 comes into contact with the surface 20a of the second joining contact layer 20.

Moreover, the second wafer 23 is placed on the surface 20a of the joining contact layer 20 in such a way that the orientation flat plane of the first wafer 22 is generally aligned with the orientation flat plane of the second wafer 23. More particularly, the second wafer 23 is placed on the surface 20a of the joining contact layer 20 in such a way that the normal of the orientation flat plane of the first wafer 22 becomes generally parallel to the normal of the orientation flat plane of the second wafer 23. As a result of this, a crystal axis of the first wafer is almost aligned with a crystal axis of the second wafer. In this case, both the orientation flat plane of the first wafer 22 and the orientation flat plane of the second wafer 23 are the (1-10) plane.

Next, the bonding step of the first wafer 22 and the second wafer 23 is performed. In the bonding step, the first wafer 22 and the second wafer 23 are bonded with use of a jig 50 shown in FIG. 1.

The jig 50 is made from quartz and has a lower base 51 for supporting the first wafer 22, a presser plate 52 for covering the upper face of the second wafer 23 in FIG. 1, and a pressing section 53 for pressing the presser plate 52 upon reception of force of a specified level.

The pressing section 53 is so arranged as to be guided vertically by a frame 54 which is in a generally U shape as viewed from the front side. The frame 54 engages with the lower base 51 to properly transfer force to the presser plate 52 positioned between the lower base 51 and the pressing section 53.

A PBN (Pyrolytic Boron Nitride) 24 is placed between the lower base 51 and the first wafer 22.

The surface 23a of the second wafer 23 is mirror-polished and is brought into contact with the mirror-polished surface 20a of the first wafer 22.

The surface 23a of the second wafer 23 is brought into contact with the surface 20a of the first wafer 22 so that a growth axis of the surface 20a of the first wafer 22 is aligned with a growth axis of the surface 23a of the second wafer 23.

A relaxation film 29 is placed on a face which is the upper face of the second wafer 23 and which is opposite from the contact face between the first wafer 22 and the second wafer 23. More particularly, the relaxation film 29 is brought into contact with the face of the second wafer 23, which is opposite from the side of the first wafer 22.

The relaxation film 29 is formed from a material having a stress relaxation rate of 1.5 to 3.0% with a tightening surface pressure in the range of 5 kg/cm² to 500 kg/cm², and has a thickness of 1 mm.

Figure 2D:
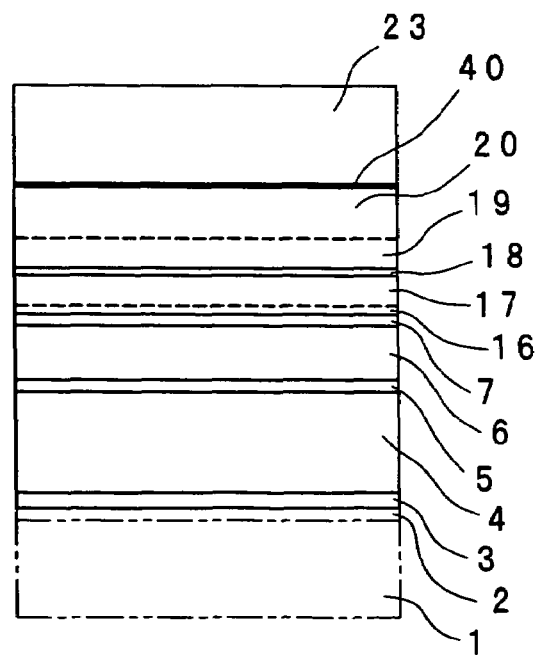
FIG. 2D is a schematic view showing a state in which the substrate and a buffer layer are removed from the first wafer to which the second wafer has been bonded.

Moreover, the PBN 25 is placed on the upper face of the relaxation film 29 (the face opposite to the second wafer 23-side face), and the presser plate 52 of the jig is brought into contact with the upper face of the PBN 25 (the face opposite to the relaxation film 29-side face). Then, appropriate force is applied to the pressing section 53 of the jig, so that compressing force is applied to the contact face between the first wafer 22 and the second wafer 23 via the presser plate 52 and the relaxation film 29. In this state, the first and second wafers 22, 23 as well as the jig 50 are set in a heating furnace and heated for one hour at a temperature of 750° C. In this case, the compressing force is applied to the contact face between the first and second wafers 22, 23 in the state that deviation of stress is reduced by the relaxation film 29. As a result, as shown in FIG. 2D, a sufficient bonding interface 40 is formed over the generally entire contact face.

Moreover, the bonding failure prevention grooves 26 can not only reduce stress in the cleavage direction which tends to cause cracks and prevent wafer cracks but can also provide a sufficient bonding state over the entire first and second wafers 22, 23.

Figure 13A:
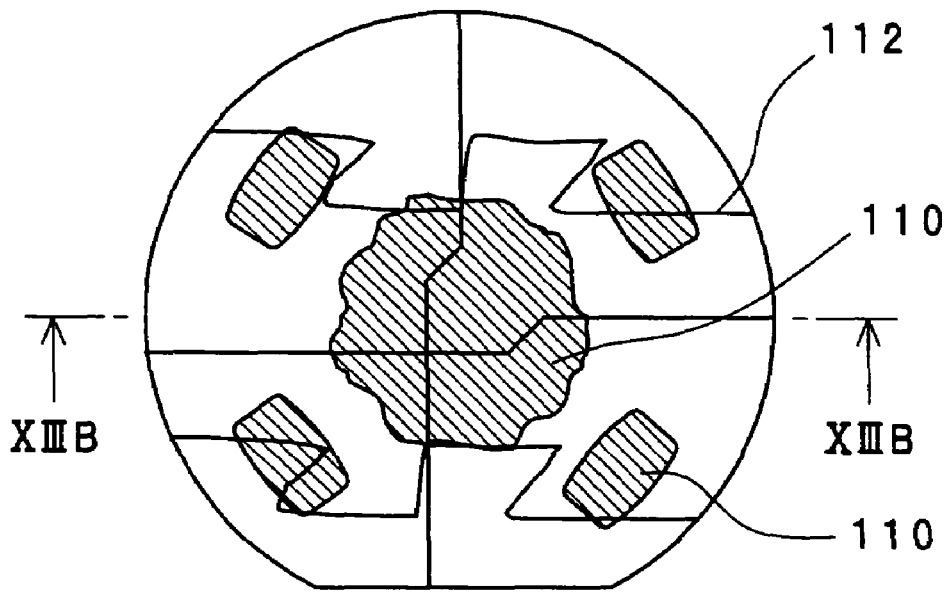
FIG. 13A is a schematic plan view showing conventional first and second wafers after bonding.
Figure 13B:
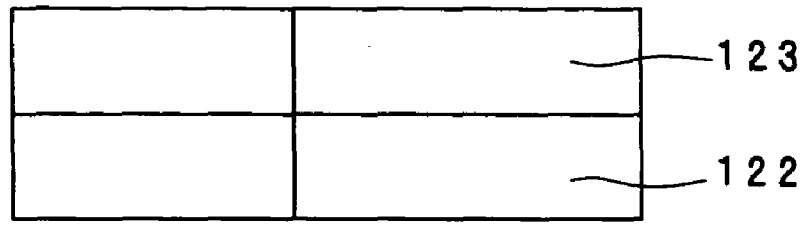
FIG. 13B is a schematic cross sectional view as viewed from the line XIIIB-XIIIB in FIG. 13A.
Figure 14A:
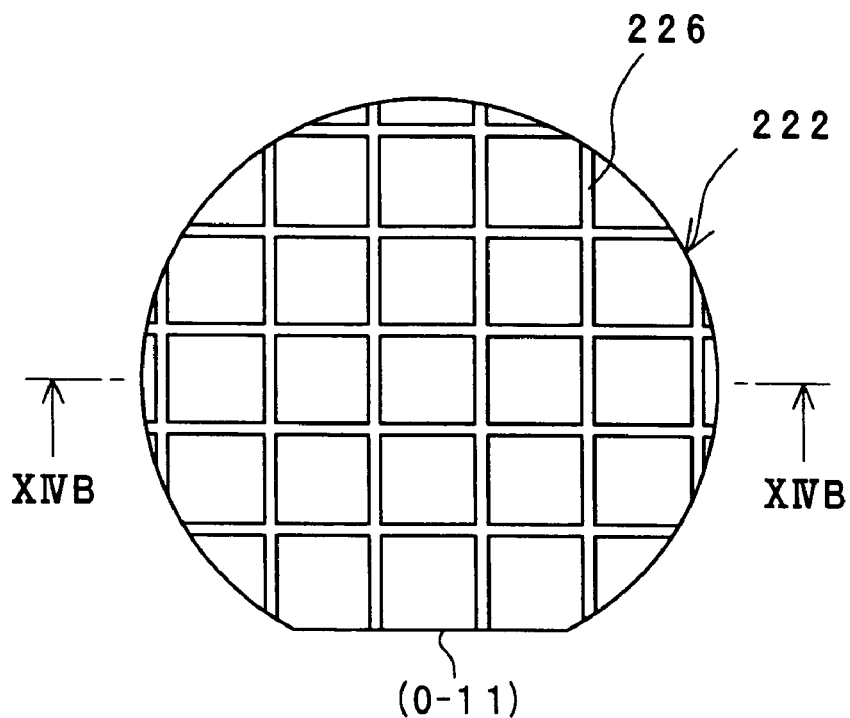
FIG. 14A is a schematic plan view showing a first experimental wafer before bonding.
Figure 14B:
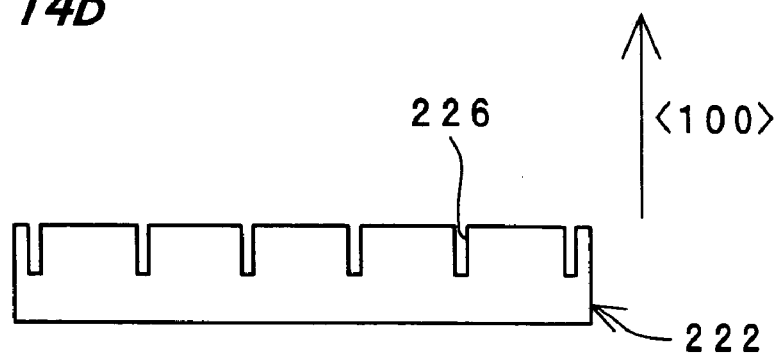
FIG. 14B is a schematic cross sectional view as viewed from the line XIVB-XIVB in FIG. 14A.
Figure 15:
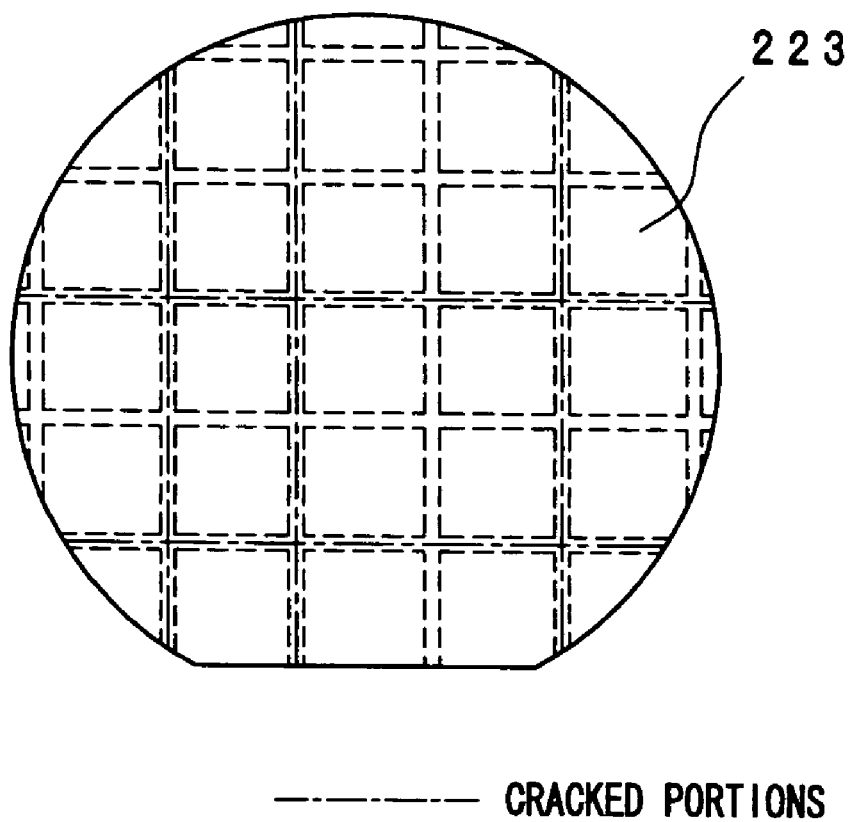
FIG. 15 is a schematic plan view showing first and second experimental wafers after bonding.

After heated and cooled, the bonded first and second wafers 22, 23 are taken out of the heating furnace. A bonded body of the first and second wafers 22, 23 subjected to such wafer bonding (direct bonding) is free from cracks, bonding failure and the like as shown in FIG. 13A.

After that, the n-type GaAs substrate 1 and the n-type GaAs buffer layer 2 included in the first wafer 22 are etched away by NH₄OH—H₂O₂ mixture solution.

Figure 2E:
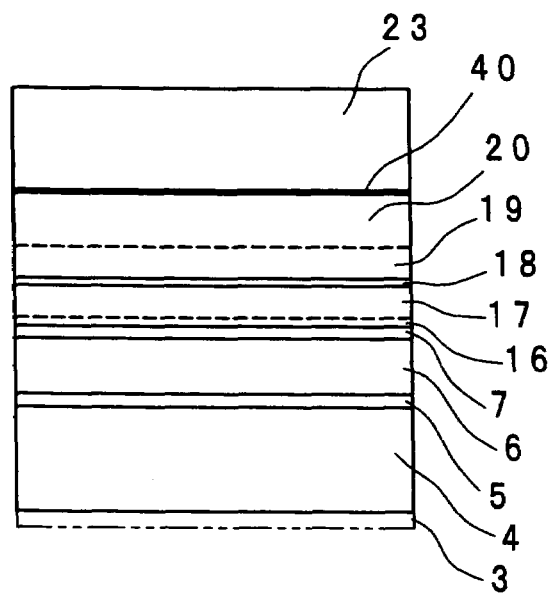
FIG. 2E is a schematic view showing a state in which an etching stop layer on the first wafer is etched away.

Subsequently, as shown in FIG. 2E, the n-type AlGaAs etching stop layer 3 included in the first wafer 22 is etched away.

Figure 2F:
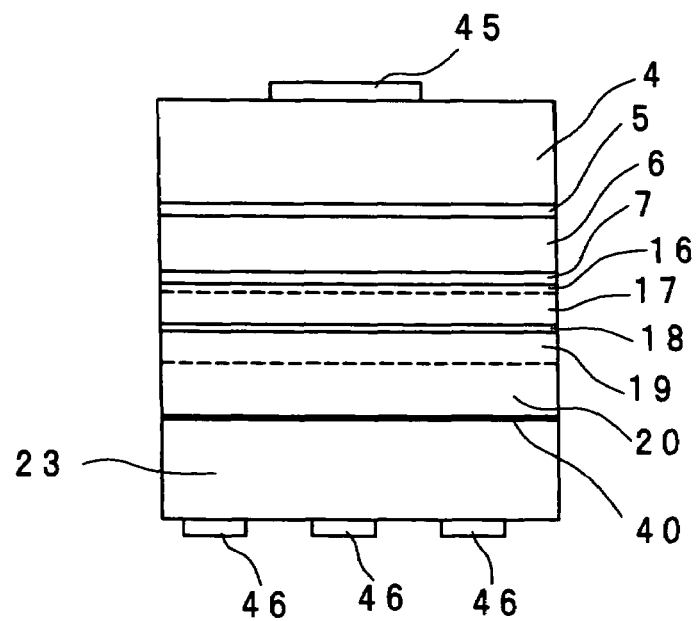
FIG. 2F is a schematic view showing a completed product of a light emitting diode.

Then, a wire bonding-side electrode 45 is formed on the surface of the current diffusion layer 4 exposed by removal of the etching stop layer 3 as shown in FIG. 2F. The face of the second wafer 23 opposite to the side of the first wafer 22 is subjected to back grinding to form the second wafer 23 into a specified thickness. After the back grinding, a die bonding-side electrode 46 is formed on the face of the second wafer 23 opposite to the side of the first wafer 22.

Subsequently, in order to alloy a connection portion between the wafer and the electrode, heat treatment is performed for 15 minutes at a temperature of about 450° C.

Then, the first and second wafers 22, 23 with the electrodes formed thereon are divided into chips by dicing, by which light emitting diodes are completed.

Thus, the bonding failure prevention grooves 26 forming an angle of about 45° with respect to the wafer cleavage direction are formed on the surface 20a of the first wafer 22 which is to be a bonding face, and therefore it becomes possible to prevent the bonded body of the first and second wafers 22, 23 from having cracks, bonding failure and the like.

Therefore, it becomes possible to uniformly bond the first and second wafers 22, 23 along the entire faces by a relatively simple method without causing wafer cracks. As a result, light emitting diodes having high emission intensity can be manufactured with a yield higher than that in the conventional cases.

Moreover, the intervals between the bonding failure prevention grooves 26 are made corresponding to a chip size, so that the bonded body of the first and second wafers 22, 23 can be divided into chips along the bonding failure prevention grooves 26 with relative ease.

Moreover, the particle size for the dicing for use in dividing into chips should preferably be in the range of #7000 to #2000 (No. 7000 to No. 2000).

Moreover, forming the bonding failure prevention grooves 26 by etching brings about such an advantage that a current blocking layer can easily be formed on the surface 20a of the first wafer 22 with use of a photomask.

Although the light emitting diode having an MQW structure emission layer has been manufactured in the present embodiment, light emitting diodes having emission layers of structures other than the quantum well structure may be manufactured.

Moreover, the present invention may widely be applied to light emitting diodes with compositions other than those in this embodiment. More particularly, the present invention is applicable to any light emitting diode without being limited to the compositions and emission colors such as red (AlGaAs, etc.), blue (GaN, InGaN, SiC, etc.), yellow (AlGaInP, etc.) and green (AlGaInP, etc.).

Although in this embodiment, the bonding failure prevention grooves 26 forming an angle of about 45° with respect to the wafer cleavage direction are formed on the surface 20a of the first wafer 22 which is to be a bonding face, the angle formed by the bonding failure prevention grooves 26 with respect to the wafer cleavage direction is not limited to 45°. More particularly, bonding failure prevention grooves extending so as to form an angle of 30 degrees to 60 degrees with respect to the {1-10} plane that is the wafer cleavage plane may be formed on the surface 20a of the first wafer 22 which is to be a bonding face.

Figure 5:
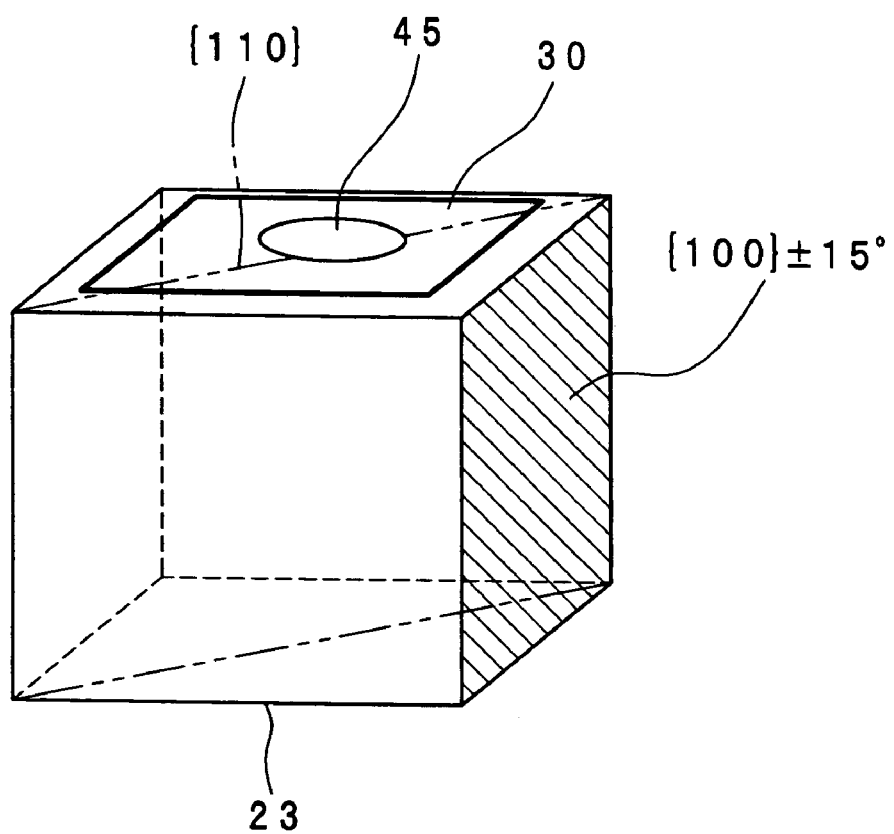
FIG. 5 is a schematic perspective view showing a light emitting diode in one embodiment of the invention.

In the case where this bonding failure prevention groove is formed on the surface 20a of the first wafer 22 which is to be a bonding face, a light emitting diode as shown in FIG. 5 is obtained. In this light emitting diode, the direction of a lateral face (hatched face) of the second wafer 23 is in the range of −15° to +15° with respect to <100> direction. More particularly, the normal line of the lateral face of the second wafer 23 is parallel to the direction in the range of −15° to +15° with respect to <100> direction. In this case, examples of the lateral face of the second wafer 23 include a (100) plane, a (−100) plane, a (010) plane, a (0-10) plane, a (001) plane, and a (00-1) plane. More particularly, an example of the lateral face of the second wafer 23 is a {100} plane. In the light emitting diode, the face having the normal parallel to the <110> direction is as shown by a two-dot chain line.

Figure 16:
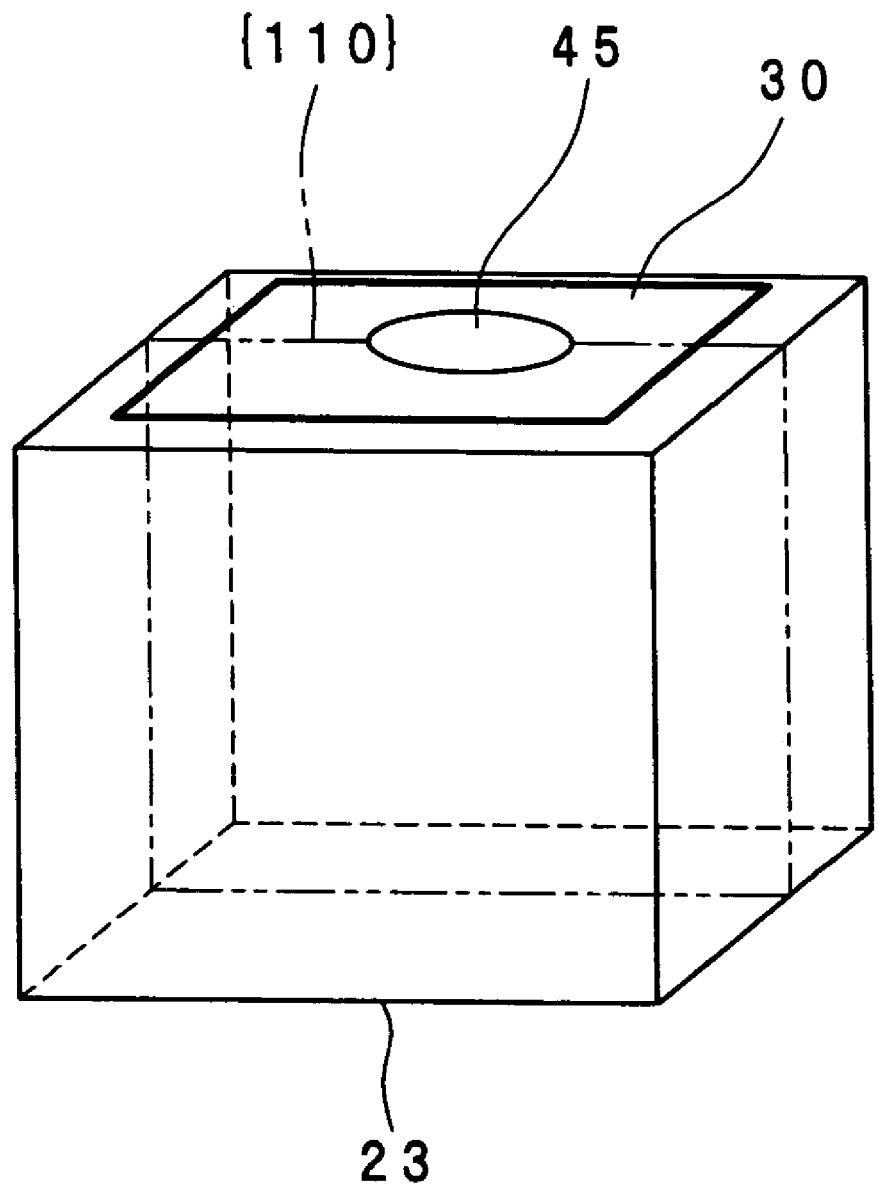
FIG. 16 is a schematic perspective view showing a conventional semiconductor light emitting device.

In a light emitting diode manufactured by the conventional manufacturing method, on the other hand, the face having the normal line parallel to the <110> direction is as shown by a two-dot chain line in FIG. 16.

It is to be noted that reference numeral 30 in FIG. 5 represents an epitaxial layer composed of an n-type AlGaAs current diffusion layer 4, an n-type AlGaInP buffer layer 5, an n-type AlInP cladding layer 6, an AlGaInP active layer 7, a spacer layer 16, a p-type AlInP cladding layer 17, an intermediate layer 18, a p-type GaInP first joining contact layer 19 and a p-type GaP second joining contact layer 20. Moreover, in FIG. 16, component members corresponding to component members in FIG. 5 are designated by reference numerals identical to those of the component members in FIG. 5.

Although the second wafer 23 made of GaP is used in this embodiment, a second wafer made of a material other than GaP may also be used.

Moreover, the second wafer of the present invention may be a wafer composed of a substrate opaque to light from an emission layer and a transparent layer transparent to the light formed thereon, and in this case, the transparent layer should be joined to the surface of the first wafer.

The present invention is applicable also to semiconductor lasers and the like other than light emitting diodes.

Although the relaxation film 29 in this embodiment has a stress relaxation rate in the range of 1.5% to 3.0% with a tightening surface pressure in the range of 5 kg/cm$^2$ to 500 kg/cm$^2$, the relaxation film 29 has only to have a stress relaxation rate in the range of 1.5% to 5.0% with a tightening surface pressure in the range of 5 kg/cm$^2$ to 500 kg/cm$^2$. More preferably, the stress relaxation rate should be 1.8% to 2.5% with the tightening surface pressure in the range of 5 kg/cm$^2$ to 20 kg/cm$^2$.

Moreover, without being limited to 1 mm, the thickness of the relaxation film 29 can be appropriately set in the range of 0.2 mm to 2.0 mm.

Moreover, the relaxation film 29 may be placed on the lower face of the first wafer 22 (the face on the lower base 51 side) instead of the upper face of the second wafer 23 (the face on the pressing section 53 side).

Figure 6:
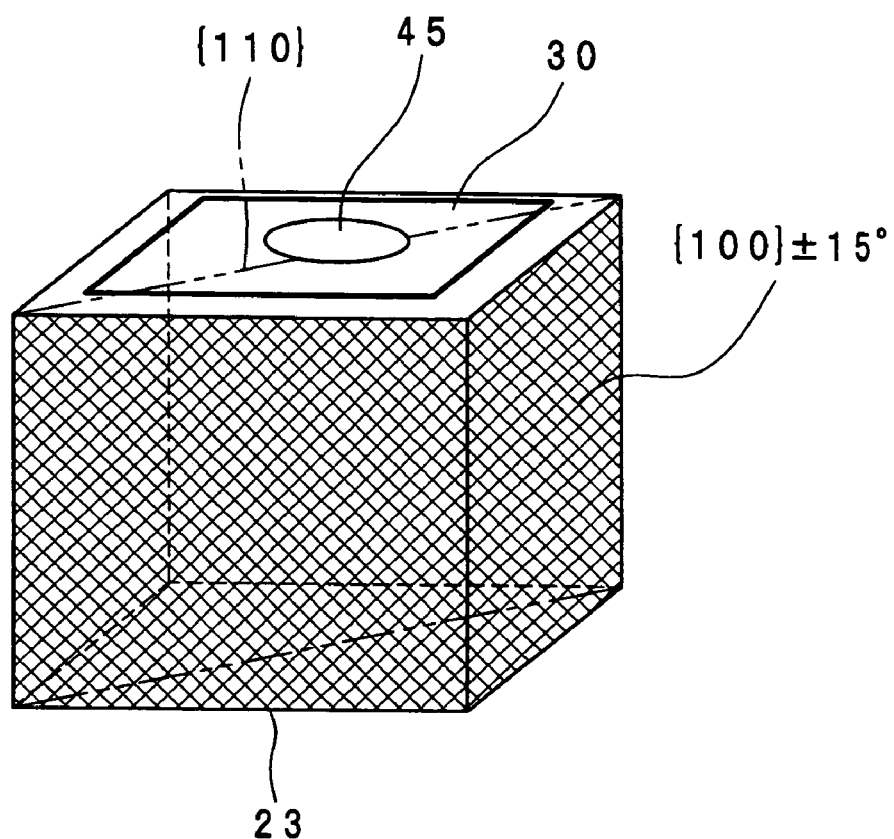
FIG. 6 is a schematic perspective view showing a light emitting diode in another embodiment of the invention.

Moreover, in the light emitting diode in this embodiment, the lateral faces of the second wafer 23 may be rough faces, or projections and depressions may be formed on the lateral faces of the second wafer 23 (lateral faces including shaded faces) as shown in FIG. 6.

Figure 7A:
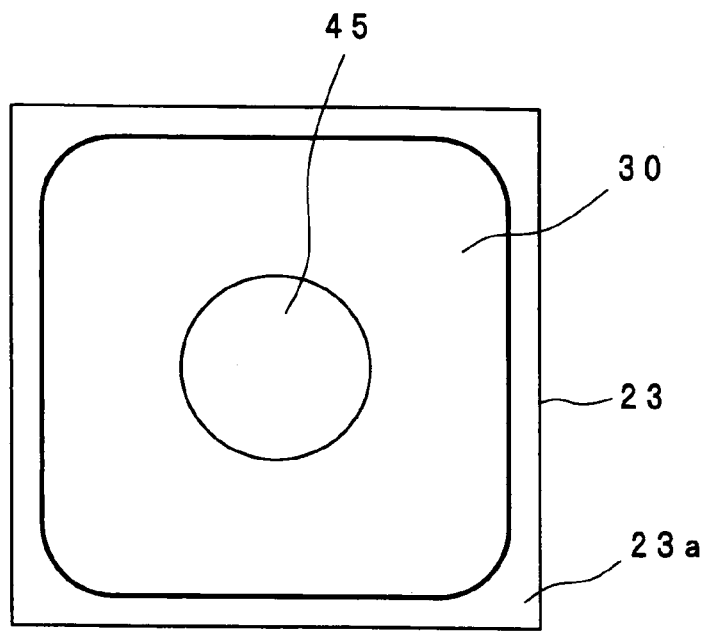
FIG. 7A is a schematic plan view showing a light emitting diode in another embodiment of the invention.
Figure 7B:
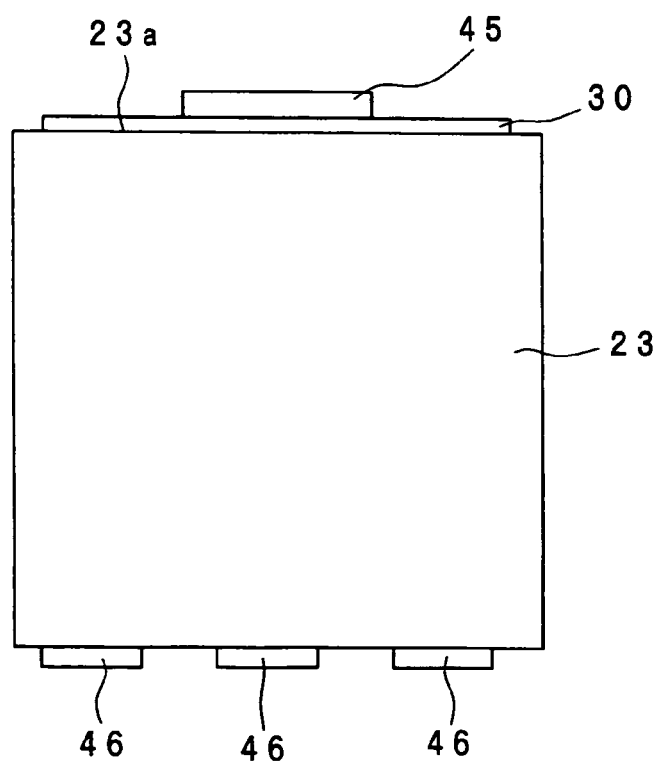
FIG. 7B is a schematic front view showing the light emitting diode in FIG. 7A.

Moreover, as shown in FIGS. 7A and 7B, four corners of the epitaxial layer 30 may be rounded by trimming.

Figure 8A:
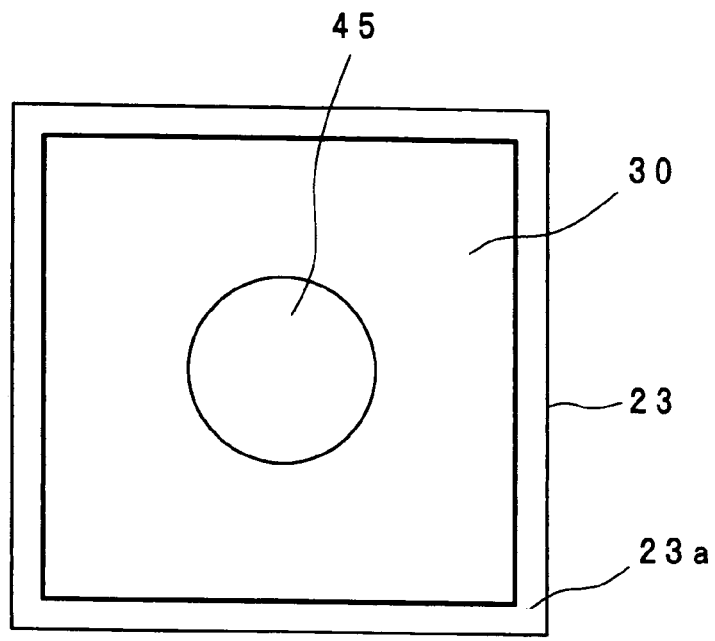
FIG. 8A is a schematic plan view showing a light emitting diode in another embodiment of the invention.
Figure 8B:
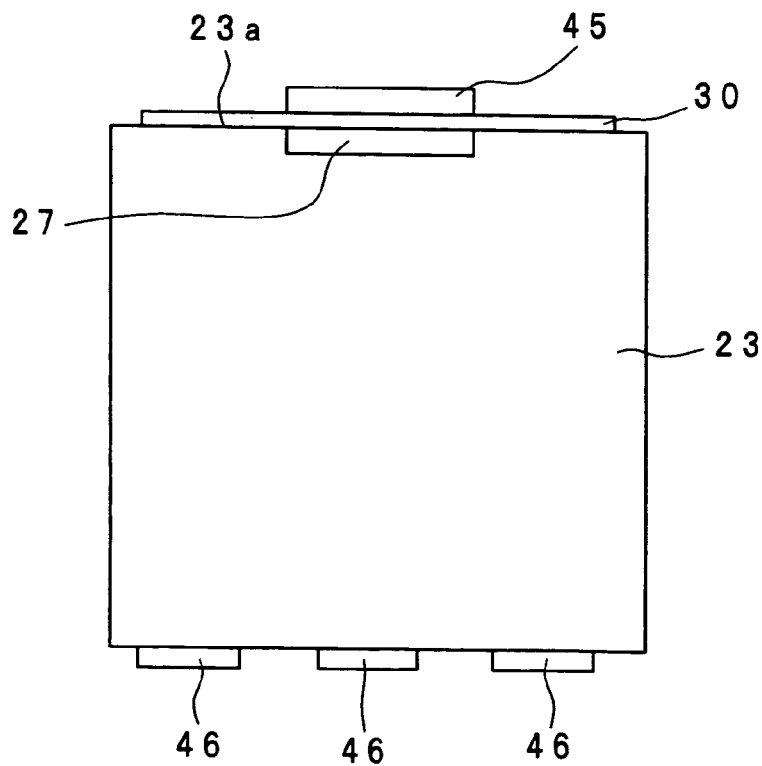
FIG. 8B is a schematic front view showing the light emitting diode in FIG. 8A.

Moreover, as shown in FIGS. 8A and 8B, a current blocking layer 27 overlapping with the wire bonding-side electrode 45 may be formed on the surface 23a of the second wafer 23. In this case, the current blocking layer 27 is generally identical in shape to the wire bonding-side electrode 45. That is, the size of the current blocking layer is generally identical to the size of the wire bonding-side electrode 45. Moreover, the current blocking layer 27 is not formed in the region not overlapping with the wire bonding-side electrode 45. That is, the current blocking layer 27 is formed so as to be confined in the region overlapping with the wire bonding-side electrode 45.

The current blocking layer 27 may be formed from, for example, an insulating material.

A current that has bypassed the current blocking layer 27 flows to the AlGaInP active layer 7. Consequently, light is emitted not in a region beneath the wire bonding-side electrode 45 where the emitted light cannot be taken out from the wire bonding-side, but in a region around the wire bonding-side electrode 45 where the emitted light can be taken out. This allows enhancement of light take-out efficiency from the wire bonding-side.

Figure 9A:
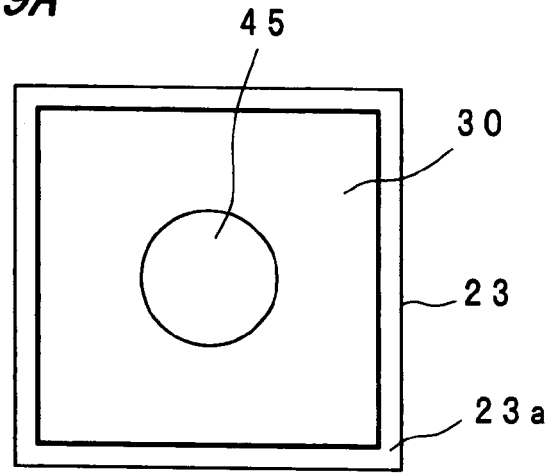
FIG. 9A is a schematic plan view showing a light emitting diode in another embodiment of the invention.
Figure 9B:
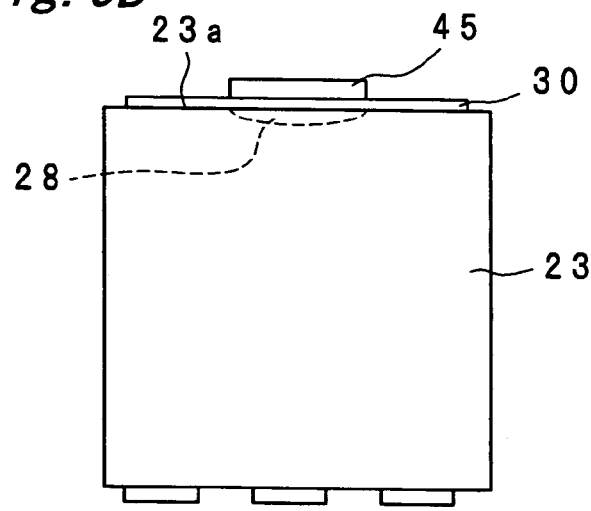
FIG. 9B is a schematic front view showing the light emitting diode in FIG. 9A.
Figure 9C:
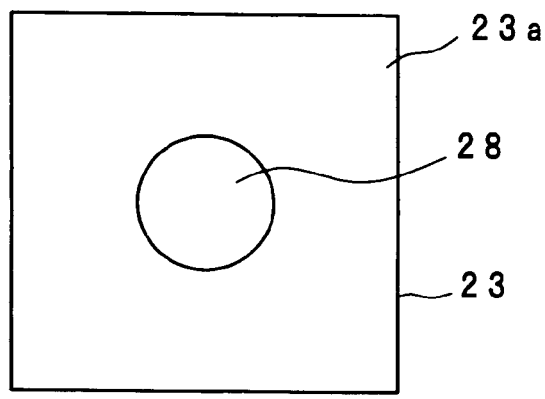
FIG. 9C is a schematic plan view showing a second wafer of the light emitting diode in FIG. 9A.

Moreover, as shown in FIGS. 9A, 9B and 9C, one depression 28 overlapping with the wire bonding-side electrode 45 may be formed on the surface 23a of the second wafer 23. In this case, the depression 28 is not formed in a region that does not overlap with the wire bonding-side electrode 45. That is, the depression 28 is formed so as to be confined in the region overlapping the wire bonding-side electrode 45. Moreover, the depression 28 is formed generally in the center of the surface 23a of the second wafer 23.

The depression 28 can easily be formed by a technique such as etching. It is needless to say that formation of the depression 28 is performed before joining the first wafer 22 and the second wafer 23.

In the case of forming the depression 28, the same effect as in the case of forming the current blocking layer 27 is achieved.

Figure 10A:
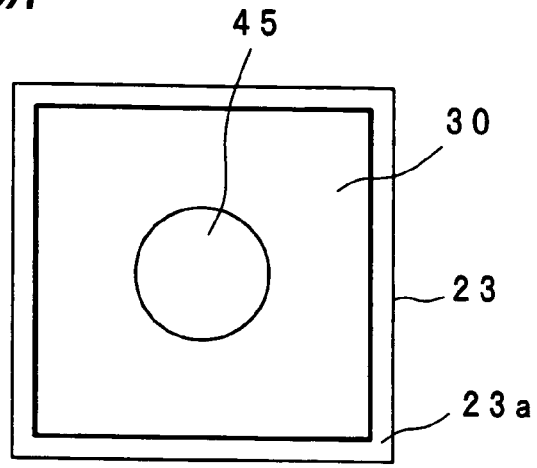
FIG. 10A is a schematic plan view showing a light emitting diode in another embodiment of the invention.
Figure 10B:
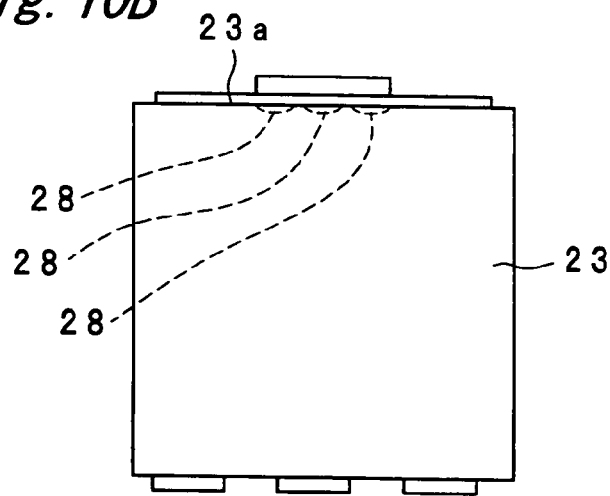
FIG. 10B is a schematic front view showing the light emitting diode in FIG. 10A.
Figure 10C:
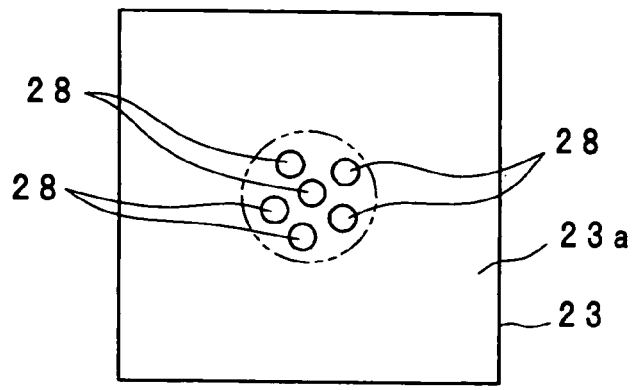
FIG. 10C is a schematic plan view showing a second wafer of the light emitting diode in FIG. 10A.
Figure 11A:
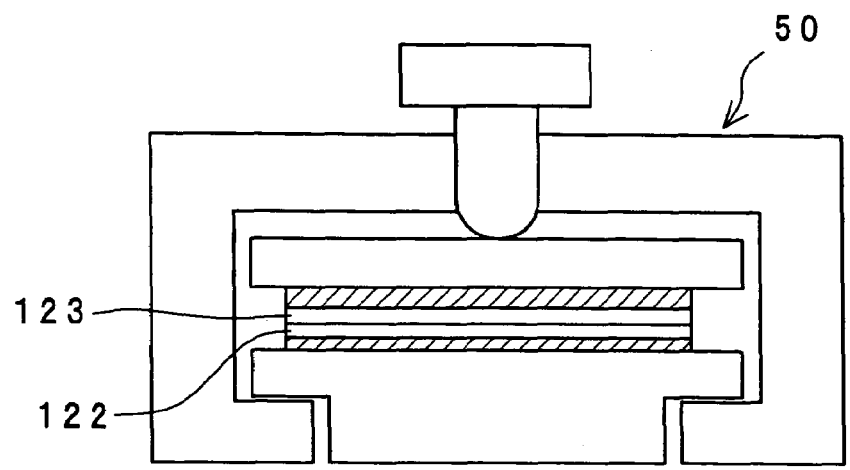
FIG. 11A is a schematic front view showing a state of a bonding step in a conventional manufacturing method for a semiconductor light emitting device.
Figure 11B:
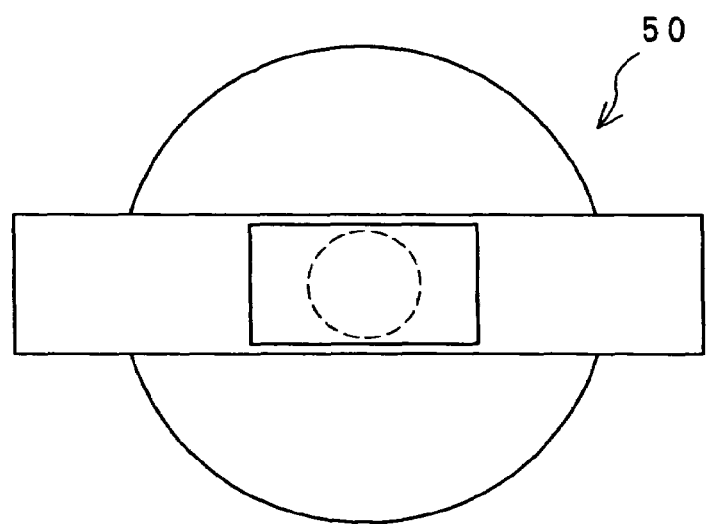
FIG. 11B is a schematic plan view showing a state of a bonding step in a conventional manufacturing method for a semiconductor light emitting device.
Figure 12A:
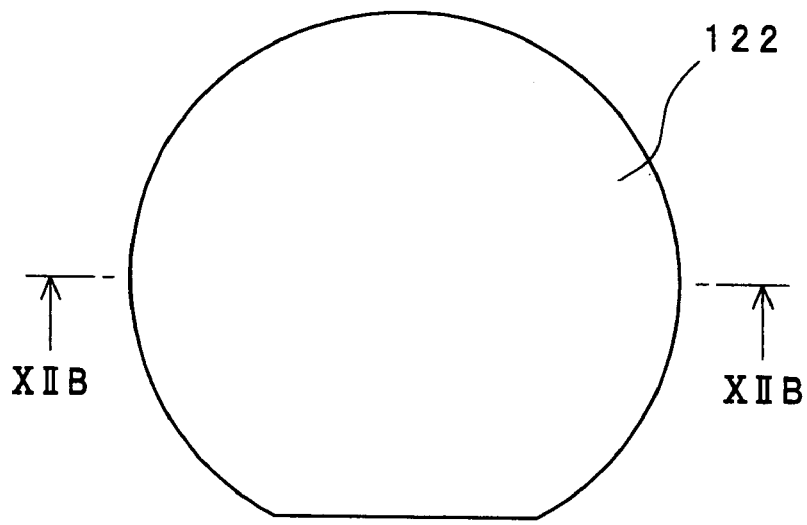
FIG. 12A is a schematic plan view showing a conventional first wafer before bonding.
Figure 12B:
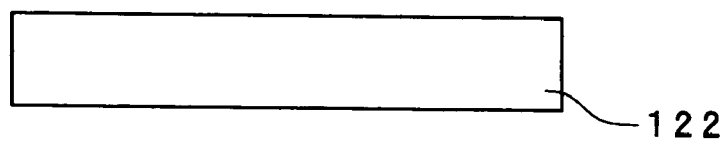
FIG. 12B is a schematic cross sectional view as viewed from the line XIIB-XIIB in FIG. 12A.

Moreover, a plurality of the depressions 28 may be formed as shown in FIGS. 10A, 10B and 10C. In this case also, all the depressions 28 are formed so as to be confined in the region overlapping with the wire bonding-side electrode 45. Moreover, the plurality of depressions 28 are formed so as to be gathered generally in the center of the surface 23a of the second wafer 23.

It is to be noted that a two-dot chain line circle in FIG. 10C represents a region overlapping with the wire bonding-side electrode 45. In this region, there is a region where no depression 28 is formed. That is, the region includes not-depressed portions.

The depth of the depression 28 in FIGS. 9A, 9B, 9C and FIGS. 10A, 10B, 10C is so set that the second wafer 23 can withstand a wire-bonding load from the upper side.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor light emitting device comprising:
  a plurality of semiconductor layers including at least an emission layer;
  a transparent layer which transmits light from the emission layer, the respective layers being laminated together; and
  a bonding failure prevention groove formed on at least either one of bonding surfaces of the plurality of semiconductor layers or the transparent layer, wherein
  crystal axes of the semiconductor layers and the transparent layer are generally aligned with each other,
  a direction of lateral faces of the transparent layer is in a range of −15° to +15° with respect to a <100> direction, and
  the bonding failure prevention groove extends so as to form an angle from 30 degrees to 60 degrees with respect to a {110} plane that is a wafer cleavage plane of the plurality of semiconductor layers and the transparent layer.

2. The semiconductor light emitting device according to claim 1, wherein
  the transparent layer has a multilayered structure.

3. The semiconductor light emitting device according to claim 1, wherein
  the lateral faces of the transparent layer are rough faces.

4. The semiconductor light emitting device according to claim 1, wherein
  projections and depressions are formed on the lateral faces of the transparent layer.

5. The semiconductor light emitting device according to claim 1,
  wherein four corners of the semiconductor layer are trimmed.

* * * * *